United States Patent [19]
Shimizu et al.

[11] Patent Number: 5,428,235
[45] Date of Patent: Jun. 27, 1995

[54] SEMICONDUCTOR MEMORY DEVICE INCLUDING IMPROVED CONNECTION STRUCTURE TO FET ELEMENTS

[75] Inventors: Masahiro Shimizu; Takehisa Yamaguchi; Natsuo Ajika, all of Hyogo, Japan

[73] Assignee: Mitsubishi Denki Kabushiki Kaisha, Tokyo, Japan

[21] Appl. No.: 300,878

[22] Filed: Sep. 6, 1994

Related U.S. Application Data

[63] Continuation of Ser. No. 69,656, Jun. 1, 1993, abandoned, which is a continuation of Ser. No. 715,831, Jun. 14, 1991, abandoned.

[30] Foreign Application Priority Data

Jun. 18, 1991 [JP] Japan .................. 2-160802

[51] Int. Cl.$^6$ ........................................... H01L 29/68
[52] U.S. Cl. ............................ 257/296; 257/306; 257/385
[58] Field of Search ............ 357/23.4, 23.6, 59 J, 357/59 K; 257/296, 306, 307, 308, 327, 385, 382

[56] References Cited

U.S. PATENT DOCUMENTS

| | | | |
|---|---|---|---|
| 4,636,834 | 1/1987 | Shepard | 357/59 |
| 4,891,327 | 1/1990 | Okumura | 357/23.6 |
| 4,922,312 | 5/1990 | Coleman et al. | 257/306 |
| 4,926,223 | 5/1990 | Bergemont . | |
| 4,942,448 | 7/1990 | Tsukamoto et al. | 257/382 |
| 5,005,072 | 4/1991 | Gonzalez | 257/306 |
| 5,045,901 | 9/1991 | Komori et al. | 357/23.4 |
| 5,101,251 | 3/1992 | Wakamiya et al. | 257/296 |
| 5,144,393 | 9/1992 | Yamaguchi et al. | 257/327 |
| 5,166,763 | 11/1992 | Wada et al. | 257/382 |
| 5,177,575 | 1/1993 | Ikeda | 257/296 |
| 5,347,151 | 9/1994 | Shimizu et al. | 257/296 |

FOREIGN PATENT DOCUMENTS

| | | |
|---|---|---|
| 0317257A2 | 5/1989 | European Pat. Off. . |
| 0352893A1 | 1/1990 | European Pat. Off. . |
| 4019137A1 | 1/1990 | Germany . |
| 54-7883 | 1/1979 | Japan .................. 257/327 |
| 56-158482 | 12/1981 | Japan .................. 257/327 |
| 60-2784 | 1/1985 | Japan . |
| 60-196967 | 10/1985 | Japan .................. 257/296 |

OTHER PUBLICATIONS

Geffken et al., "Process for High–Capacitance Single–Device Memory Cell," IBM Technical Disclosure Bulletin, vol. 21, No. 6, Nov. 1978, pp. 2257–2259.

Primary Examiner—Jerome Jackson
Assistant Examiner—Courtney A. Bowers
Attorney, Agent, or Firm—Lowe, Price, LeBlanc & Becker

[57] ABSTRACT

A memory cell of a DRAM comprises one MOS transistor and one capacitor. The MOS transistor includes a pair of source/drain regions and a gate electrode formed on the channel region. A bit line is formed so as to be connected to the source/drain region. A conductive layer is formed so as to be connected to the source/drain region. The gate electrode includes a first part formed on the channel region with an oxide film interposed and second and third parts extending from the first part, respectively, and formed on the bit line and the conductive layer with an interlayer oxide film interposed. The capacitor includes a lower electrode formed so as to be connected to the conductive layer and an upper electrode formed so as to be opposed to the surface of the lower electrode with a dielectric film interposed. The upper electrode is placed above the bit line. A word line is placed above the upper electrode and connected to the gate electrode. It is possible to provide a field effect transistor in which increase in speed can be realized and to provide a semiconductor memory device in which capacitance of the capacitor can be sufficiently secured in case of making miniaturization of the memory cell. It is also possible to prevent decrease in reliability caused by disconnection of the bit line.

8 Claims, 8 Drawing Sheets

SEMICONDUCTOR MEMORY DEVICE INCLUDING IMPROVED CONNECTION STRUCTURE TO FET ELEMENTS

This application is a continuation of application Ser. No. 08/069,656, filed Jun. 1, 1993, abandoned, which is a continuation of application Ser. No. 07/715,831, filed on Jun. 14, 1991, abandoned.

BACKGROUND OF THE INVENTION

1. Field of the Invention

The present invention relates to semiconductor memory devices and methods of manufacturing the same, and particularly to a semiconductor memory device, for example, a dynamic random access memory (hereinafter referred to as DRAM) having memory cells comprising a field effect transistor and a capacitor, and a method of manufacturing the same.

2. Description of the Background Art

In recent years, the demand for semiconductor memory devices has been rapidly increased according to the remarkable spread of information equipment such as computers. In addition, functionally, semiconductor memory devices having large-scale storage capacity and capable of high-speed operation are demanded. Under such a background, technical development is in progress with respect to a high degree of integration and high response rate or high reliability of semiconductor memory devices.

Among semiconductor memory devices, there is a DRAM which is capable of random input/output of storage information. Generally, a DRAM is implemented with a memory cell array, which is a storage region for storing a large number of bits of information, and peripheral circuits necessary for entry from and withdrawal to the outside.

FIG. 5 is a block diagram illustrating a structure of a general DRAM. Referring to FIG. 5, a DRAM 50 comprises a memory cell array 51, a row and column address buffer 52, a row decoder 53 and a column decoder 54, a sense refresh amplifier 55, a data in buffer 56 and a data out buffer 57, and a clock generator 58. Memory cell array 51 is for storing a data signal of storage information. Row and column address buffer 52 is for receiving address signals $A_0$–$A_9$ from the outside for selecting a memory cell which constitutes a unit storage circuit. Row decoder 53 and column decoder 54 are for specifying a memory cell by decoding the address signal. Sense refresh amplifier 55 is for amplifying and reading the signal stored in the specified memory cell. Data in buffer 56 and data out buffer 57 are for data input/output. Clock generator 58 generates a clock signal becoming a control signal to each part.

Over more than ten years in the past, the degree of integration of a DRAM implemented as described above has been increased at a speed of approximately four times in three years. There is no sign that this tendency declines after the current four megabit level has been achieved, and it seems to also continue in the future. However, high degree of integration largely depends on miniaturization of memory cells. Because of reduction in capacitance according to miniaturization, problems of soft errors and so on have arisen. In order to solve these problems and secure capacitance larger than a constant value, a memory cell having a structure of a trench-type capacitor formed by etching a semiconductor substrate in a trench shape or a stack-type capacitor stacked on a semiconductor substrate or the like has been developed.

FIG. 6 is a partial plan view illustrating a planar arrangement of memory cells of a DRAM comprising stack-type capacitors, for example shown in Japanese Patent Publication No. 60-2784 (1985). FIG. 7 is a diagram illustrating an equivalent circuit of four bits of the memory cells constituting the memory cell array shown in FIG. 6. The memory cell array comprises a plurality of word lines WL extending parallel in the row direction and a plurality of bit line pairs BL, $\overline{BL}$ extending parallel in the column direction. Referring to FIGS. 6 and 7, memory cells $C_{00}$, $C_{01}$ are provided in the vicinity of the crossings of word lines $WL_{00}$, $WL_{01}$ and bit line $BL_{00}$. Memory cells $C_{02}$, $C_{03}$ are provided in the vicinity of the crossings of word lines $WL_{02}$, $WL_{03}$ and bit line $\overline{BL_{00}}$. The capacitor of each memory cell is implemented with a lower electrode $E_{00}$, an upper electrode $E_{01}$, and an oxide film (not shown in FIG. 6) between these electrodes. In FIG. 6, bit lines $BL_{00}$, $\overline{BL_{00}}$ are connected via a contact hole CH to an impurity diffusion region of a semiconductor substrate. In FIG. 7, a pair of bit lines $BL_{00}$, $\overline{BL_{00}}$ are arranged parallel with each other in regard to a sense amplifier SA. Such an arrangement of bit lines are referred to as a folded bit line type. The sense amplifier SA is for detecting and amplifying a signal from each memory cell C.

FIG. 8 is a partial sectional view illustrating a sectional structure taken along the line VIII—VIII in FIG. 6. Referring to FIG. 8, a structure of a memory cell of a DRAM comprising a conventional stack-type capacitor will be described.

A field oxide film 32 as an element isolation region is formed on a prescribed surface of a p-type silicon semiconductor substrate 31. An island region as an element formation region is electrically isolated by field oxide film 32. In the island region, n+ source/drain regions 33, 34 are formed so as to have a prescribed space between them. A channel region 35 is formed between n+ source/drain regions 33 and 34. A gate oxide film, 36 is formed on channel region 35. A gate electrode (word line $WL_{01}$) 37 comprising a polysilicon layer is formed on gate oxide film 36 so as to extend in a direction crossing at right angles the direction of the channel length of the channel region 35. An interlayer oxide film 38 is formed so as to coat the surface of gate electrode 37. A word line ($WL_{02}$) 39 comprises a polysilicon layer and is formed on field oxide film 32. An interlayer oxide film 40 is formed so as to coat the surface of a word line ($WL_{02}$) 39.

A capacitor lower electrode ($E_{00}$) 41 comprising a polysilicon layer is formed so as to be in contact with n+ source/drain region 34. In addition, capacitor lower electrode 41 is formed so as to extend on field oxide film 32, and formed on gate electrode 37, with interlayer oxide film 38 interposed, and on word line 39, with interlayer oxide film 40 interposed. An interlayer oxide film 42 is formed so as to coat the surface of capacitor lower electrode ($E_{00}$) 41. A capacitor upper electrode (a plate electrode)($E_{01}$) 43 comprising a polysilicon layer is formed so as to be opposed to the surface of capacitor lower electrode ($E_{00}$) 41 with interlayer oxide film 42 interposed.

A PSG film 44 is formed on the whole surface of p-type silicon semiconductor substrate 31 so as to coat the capacitor implemented as described above. A contact hole (CH) 45 is opened in PSG film 44 so as to expose the surface of n+ source/drain region 33. A bit line (BL$_{00}$) 46 is connected via contact hole (CH) 45 to n+ source/drain region 33. Bit line 46 comprises a metal layer including aluminum and is formed so as to extend in a direction along the direction of the channel length of channel region 35.

A conventional memory cell 47 is implemented as described above. According to the structure of this memory cell, a part of capacitor lower electrode 41 and capacitor upper electrode 43 extends, curving, up to above gate electrode 37 and word line 39. As a result, it is possible to enlarge the area of the capacitor and to secure capacitance larger than a constant value.

In conventional memory cell 47 as described above, however, capacitor lower electrode 41 and capacitor upper electrode 43 are formed, being stacked on the surface of p-type silicon semiconductor substrate 31. This causes the step between the upper surface of PSG film 44, as an insulating layer coating capacitor lower electrode 41 and capacitor upper electrode 43, and the surface of p-type silicon semiconductor substrate 31 to become larger. Consequently, the aspect ratio of contact hole 45 for connecting bit line 46 to n+ source/drain region 33 increases. The increase in the aspect ratio degrades completeness of coating the surface of PSG film in contact hole 45 by bit line 46. Accordingly, there was a problem that disconnection of the bit line tends to happen inside contact hole 45 and reliability of the semiconductor memory device is degraded.

In addition, there was a problem that a photolithography process with extremely high precision is necessary for forming contact hole 45 having a high aspect ratio as described above, and it involves a technical difficulty in manufacturing.

Furthermore, in the conventional memory cell 47 as described above, gate electrode (word line) 37 is also miniaturized as the degree of integration is increased. Accordingly, there was a possibility that the resistance increases when current flows in gate electrode 37, and a response to a signal is delayed. Therefore, it was necessary to attempt to further increase the speed without delaying the response to the signal.

It was also necessary to obtain a structure of a memory cell in which capacitance of a capacitor can be sufficiently secured in order to further advance miniaturization of a memory cell.

SUMMARY OF THE INVENTION

One object of the present invention is to provide a structure of a filed effect transistor which enables implementing high-speed operation.

Another object of the present invention is to make it possible to secure larger capacitance of a capacitor than a constant value while miniaturizing a memory cell.

Still another object of the present invention is to prevent decrease in reliability caused by disconnection of a bit line in a semiconductor memory device.

A further object of the present invention is to manufacture a field effect transistor capable of preventing increase of resistance when current flows in a gate electrode and suitable for increase in speed.

Another object of the present invention is to provide a method of manufacturing a semiconductor memory device in which it is possible to sufficiently secure capacitance of a capacitor and to connect a conductive layer such as a bit line and so on to an impurity region without carrying out a photolithography process with high precision.

A field effect transistor according to one aspect of the present invention comprises a semiconductor substrate of a first conductive type, a pair of impurity regions of a second conductive type, a first conductive layer, a second conductive layer, and a gate electrode. The semiconductor substrate has a main surface. The impurity regions are formed so as to have a space between them for forming a channel region on the main surface of the semiconductor substrate. The first conductive layer is formed so as to be electrically connected to one of the impurity regions. The second conductive layer is formed so as to be electrically connected to the other impurity region. The gate electrode is formed on the channel region. The gate electrode includes a first part, a second part, and a third part. The first part is formed on the channel region with a first insulating layer interposed. The second part extends from the first part and is formed on the surface of the first conductive layer with a second insulating layer interposed. The third part extends from the first part and is formed on the surface of the second conductive layer with a third insulating layer interposed.

A semiconductor memory device according to a second aspect of the present invention comprises a semiconductor substrate of a first conductive type, a pair of impurity regions of a second conductive type, a gate electrode, a first conductive layer, one electrode of a capacitor, another electrode of the capacitor, and a second conductive layer. The impurity regions are formed so as to have a space between them in the direction of the channel length so as to form a channel region on a main surface of the semiconductor substrate. The gate electrode is formed on the channel region with a first insulating layer interposed. The first conductive layer is formed so as to be electrically connected to one of the impurity regions. The one electrode of the capacitor is formed so as to be electrically connected to the first conductive layer. The other electrode of the capacitor is formed so as to be opposed to the surface of the one electrode of the capacitor with a dielectric layer interposed. The second conductive layer constitutes a part of a word line and is formed so as to be electrically connected to the gate electrode. The second conductive layer includes a first part and a second part. The first part is formed so as to be in contact with the surface of the gate electrode. The second part extends from the first part and is formed on the other electrode of the capacitor with a second insulating layer interposed.

A semiconductor memory device according to a third aspect of the present invention comprises a semiconductor substrate of a first conductive type, a first insulating layer, a pair of impurity regions of a second conductive type, a first conductive layer, and a second conductive layer. The first insulating layer is formed so as to isolate an element formation region on a main surface of the semiconductor substrate. The impurity regions are formed so as to have a space between them in the direction of a channel length for forming a channel region in the element formation region and be adjacent to the first insulating layer, respectively. The first conductive layer constitutes a part of a bit line and is formed so as to be electrically connected to one of the impurity regions. The first conductive layer includes a first part and a second part. The first part is formed so as to be in contact with the surface of one of the impurity regions. The second part extends from the first part and is formed on the first insulating layer adjacent to one of the impurity regions. The second conductive layer is formed so as to be electrically connected to an electrode constituting a capacitor and electrically connected to the other of the impurity regions. The second conductive layer includes a first part and second part. The first part is formed so as to be in contact with the surface of the other of impurity regions. The second part extends from the first part and is formed on the first insulating layer adjacent to the other of impurity regions.

According to a method of manufacturing a field effect transistor according to a fourth aspect of the present invention, first, a first insulating layer is formed so as to isolate an element formation region on a main surface of a semiconductor substrate of a first conductive type. A first conductive layer is formed on a part of the element formation region and on the first insulating layer adjacent to the part. A second conductive layer is formed on a part of region spaced apart from the first conductive layer in the element formation region and on the first insulating layer adjacent to the part. A second insulating layer is formed on a side surface of the first conductive layer. A third insulating layer is formed on a side surface of the second conductive layer. A gate electrode is formed on the element formation region between the second insulating layer and the third insulating layer, with a fourth insulating layer interposed, and on the first conductive layer and the second conductive layer, with a fifth insulating layer interposed, respectively. A pair of impurity regions of a second conductive type are formed by introducing an impurity of the second conductive type in the element formation region using the gate electrode as a mask. The impurity regions are formed so as to have a space between them for forming a channel region in the element formation region.

According to a method of manufacturing a semiconductor memory device according to a fifth aspect of the present invention, first, a field effect transistor is formed as described above. One electrode of a capacitor is formed so as to be electrically connected to the first conductive layer. Another electrode of the capacitor is formed so as to be opposed to the surface of the one electrode of the capacitor with a dielectric layer interposed and extend on the second conductive layer constituting a bit line. A sixth insulating layer is formed so as to coat the other electrode of the capacitor. A contact hole is formed so as to expose a part of the surface of the gate electrode by selectively removing the sixth insulating layer. A word line is formed so as to be electrically connected via the contact hole to the gate electrode.

In the field effect transistor according to the first aspect of the present invention, both ends of the gate electrode are formed so as to extend along the direction of the channel length up to above the first conductive layer and the second conductive layer. Therefore, even if the element formation region, specifically the channel region, is miniaturized in accordance with a high degree of integration of the semiconductor memory device, the size of the section along the direction of the channel length of the gate electrode can be secured to be larger than a constant value. Accordingly, it is possible to prevent the increase in resistance when current flows in the gate electrode.

In the semiconductor memory device according to the second aspect of the present invention, the capacitor can be formed so as to be placed lower than a word line and, further, placed above a bit line connected to the other impurity region. This increases the freedom of the region forming the capacitor. As a result, the capacitor is formed so as to extend from above the gate electrode to reach above the bit line. Therefore, since the area of the capacitor can be increased, it is possible to provide a semiconductor memory device in which capacitance of a capacitor can be sufficiently secured in case of making miniaturization of a memory cell.

In a semiconductor memory device according to the third aspect of the present invention, the first conductive layer constituting a bit line is electrically connected to the impurity region without extending through a contact hole. Therefore, the bit line is electrically connected to the impurity region without going through the step part. This means that the increase in the aspect ratio caused in accordance with a high degree of integration of a semiconductor memory device does not influence the connection structure of the bit line. Accordingly, it is possible to prevent disconnection of the bit line resulting from increase in the aspect ratio and to provide a semiconductor memory device with high reliability.

In the method of manufacturing a field effect transistor according to the fourth aspect of the present invention, the first conductive layer and the second conductive layer are formed so as to be connected to the element formation region without extension through a contact hole interposed. The gate electrode is formed on the first conductive layer and the second conductive layer. The impurity regions are formed in the element formation region by introducing an impurity in the element formation region using the gate electrode as a mask. This makes it possible to electrically connect the first conductive layer and the second conductive layer to the impurity regions without carrying out a photolithography process with a high precision. Accordingly, the manufacturing process of a field effect transistor becomes more simple.

In the method of manufacturing a semiconductor memory device according to the fifth aspect of the present invention, the bit line is formed so as to be connected to an impurity region without a contact hole interposed. The capacitor is formed so as to extend on the bit line. Therefore, a step of forming a contact hole for connecting the bit line becomes unnecessary. On the other hand, the gate electrode is formed so as to extend in the direction of the channel length onto the first conductive layer connected to the one electrode of the capacitor and the second conductive layer constituting the bit line. It is not necessary to provide the contact hole formed for connecting the word line to the gate electrode to the extent that it reaches the surface of the semiconductor substrate. Specifically, the aspect ratio of the contact hole is suppressed to be low. Accordingly, it is possible both to connect the bit line to the impurity region without carrying out a photolithography process with a high precision and to easily connect the word line to the gate electrode. This makes manufacture of a semiconductor memory device easier.

As described above, according to the present invention, it is possible to provide a field effect transistor in which increase in resistance can be prevented when current flows in a gate electrode and which is suitable for speeding up. In addition, it is possible to provide a semiconductor memory device in which the area of a capacitor can be increased and capacitance of a capacitor can be sufficiently secured in case of making miniaturization of a memory cell. Furthermore, a semiconductor memory device in which disconnection of a bit line caused by increase in the aspect ratio can be prevented and which has higher reliability. On the other hand, it is possible to connect a conductive layer to an impurity region without carrying out a photolithography process with a high precision, and manufacture of a field effect transistor or a semiconductor memory device becomes easier.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
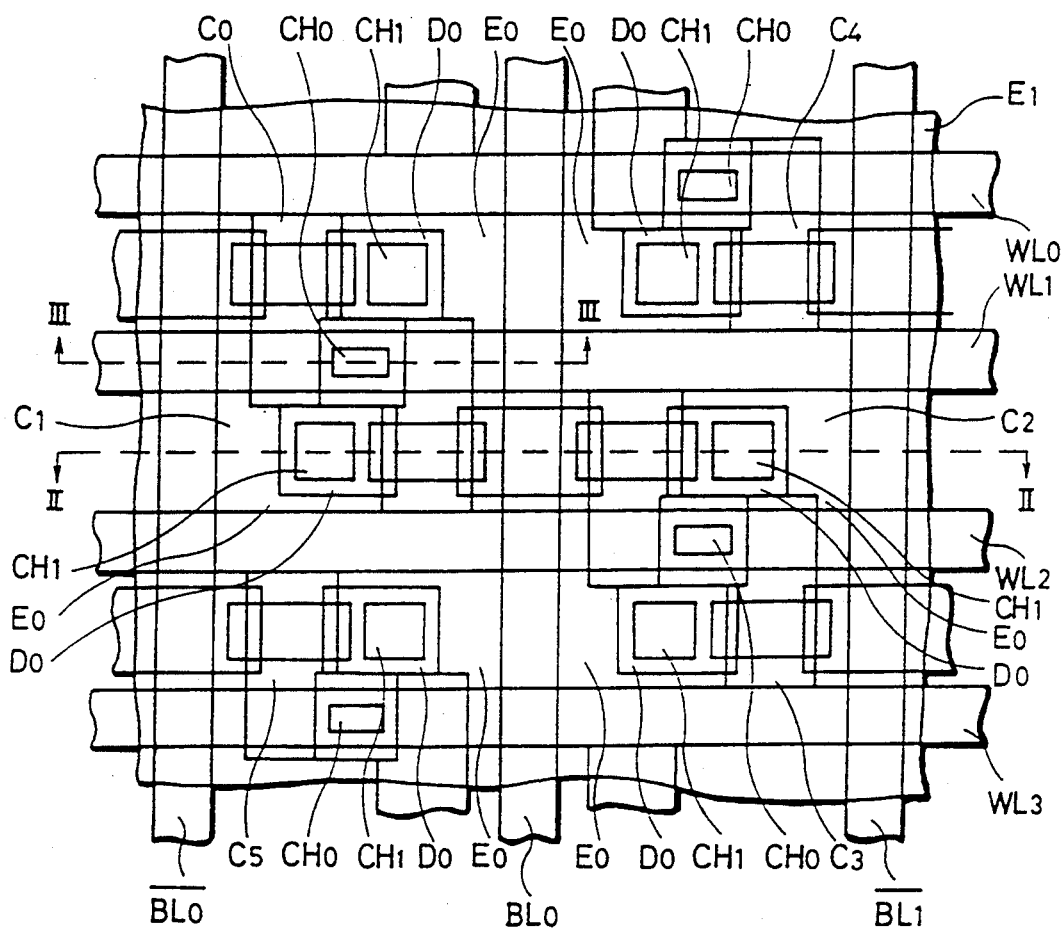
FIG. 1 is a partial plan view illustrating a planar arrangement of a semiconductor memory device according to one embodiment of the present invention.
Figure 2:
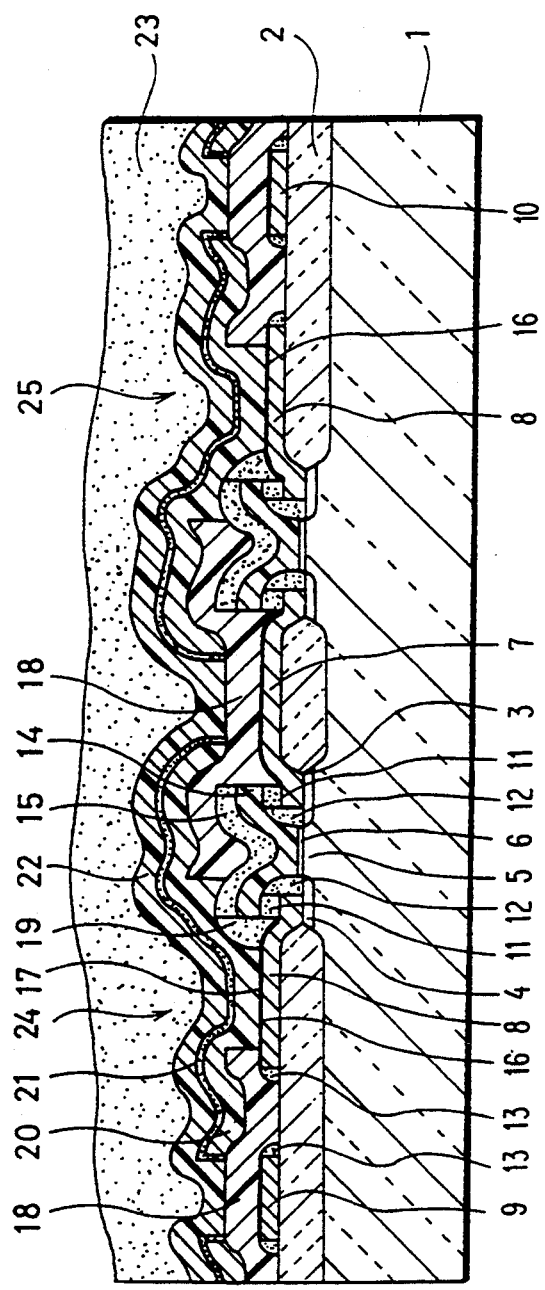
FIG. 2 is a partial sectional view illustrating a sectional structure taken along the line II—II in FIG. 1.
Figure 3:
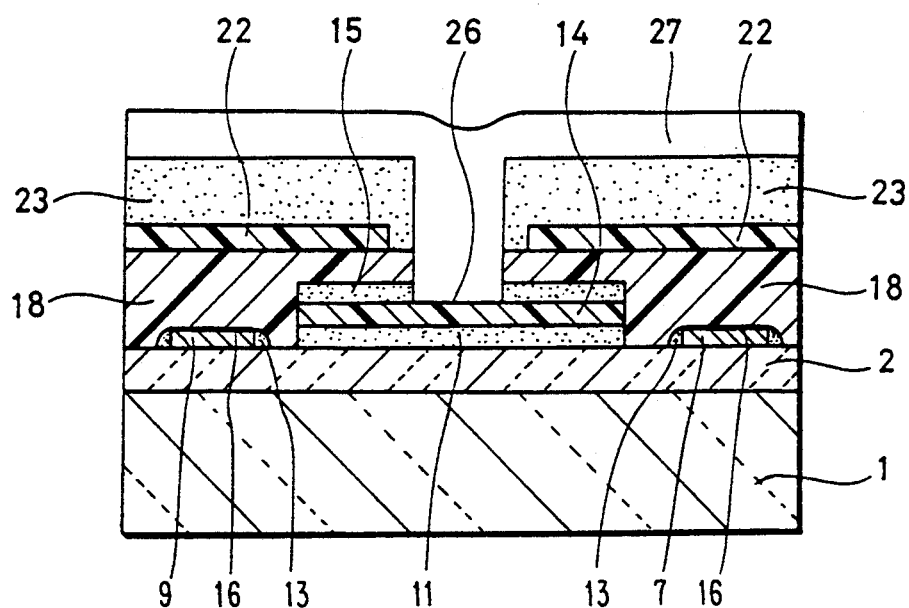
FIG. 3 is a partial sectional view illustrating a sectional structure taken along the line III—III in FIG. 1.

Referring to FIGS. 1-3, description is given on a structure of a memory cell array region of a DRAM as a semiconductor memory device according to one embodiment of the present invention.

As shown in FIG. 1, memory cells $C_0$, $C_1$ are provided in the vicinity of crossings of a word line $WL_1$ and bit lines $\overline{BL_0}$, $BL_0$. Memory cells $C_2$, $C_3$ are provided in the vicinity of crossings of a word line $WL_2$ and bit lines $BL_0$, $\overline{BL_1}$. A memory cell $C_4$ is provided in the vicinity of a crossing of a word line $WL_0$ and the bit line $\overline{BL_1}$. A memory cell $C_5$ is provided in the vicinity of a crossing of a word line $WL_3$ and the bit line $\overline{BL_0}$. The capacitor of each memory cell is implemented with a lower electrode $E_0$, an upper electrode $E_1$, and an oxide film (not shown in FIG. 1) provided between these electrodes. The word lines $WL_0$–$WL_3$ are connected via a contact hole $CH_0$ to a gate electrode. The lower electrode $E_0$ is connected via a contact hole $CH_1$ to a conductive layer $D_0$.

As shown in FIG. 2, a field oxide film 2 as an element isolation region is formed on a main surface of a p-type silicon semiconductor substrate 1 having an impurity concentration of $1 \times 10^{15}$ cm$^{-3}$ and resistivity of $10\Omega$·cm. A n$^+$ source/drain region 3 having an impurity concentration of approximately $1 \times 10^{20}$ cm$^{-3}$ is formed in an island region isolated by the field oxide film 2. An n$^+$ source/drain region 4 having an impurity concentration of approximately $1 \times 10^{20}$ cm$^{-3}$ is formed in an island region isolated by field oxide film 2 in the same manner as n$^+$ source/drain region 3 is formed. A channel region 5 is formed between n$^+$ source/drain regions 3 and 4. A gate oxide film 6 is formed on channel region 5. A conductive layer (the bit line $BL_0$) 7 comprising a polysilicon layer is formed in contact with n$^+$ source/drain region 3 with its part and be electrically connected to n$^+$ source/drain region 3. Conductive layer (bit line) 7 is formed so as to extend on the surface of field oxide film 2 and extend along a direction crossing at right angles the direction of the channel length of channel region 5. A conductive layer ($D_0$) 8 is formed with its one end in contact with n$^+$ source/drain region 4 and electrically connected to it. Conductive layer 8 comprises a polysilicon layer and is formed so as to extend on the surface of field oxide film 2. A conductive layer (the bit line $\overline{BL_0}$) 9 comprises a polysilicon layer and formed so as to extend on the surface of field oxide film 2 and extend along a direction crossing at right angles the direction of the channel length of channel region 5. A conductive layer (the bit line $\overline{BL_1}$) 10 comprises a polysilicon layer and formed so as to extend on the surface of field oxide film 2 and extend in a direction crossing at right angles the direction of the channel length of channel region 5 in the same manner as bit line ($\overline{BL_0}$) 9 is formed.

As shown in FIG. 2, an interlayer oxide film 11 is formed on n$^+$ source/drain region 3, with bit line ($BL_0$) 7 interposed, or on n$^+$ source/drain region 4, with conductive layer ($D_0$) 8 interposed. Furthermore, as shown in FIG. 3, interlayer oxide film 11 is formed so as to extend on the surface of field oxide film 2 in a direction crossing at right angles the direction of the channel length of channel region 5. As shown in FIG. 2, a sidewall oxide film 12 is in contact with the surface of n$^+$ source/drain region 3 and is formed on a side surface of bit line ($BL_0$) 7 and interlayer oxide film 11. Furthermore, sidewall oxide film 12 is in contact with the surface of n$^+$ source/drain region 4 and is formed on the side surfaces of conductive layer ($D_0$) 8 and interlayer oxide film 11. A sidewall oxide film 13 is in contact with field oxide film 2 and is formed on a side surface of conductive layer ($D_0$) 8, bit line ($\overline{BL_0}$) 9, or bit line ($\overline{BL_1}$) 10.

As shown in FIG. 2, a gate electrode 14 is formed with its bottom surface in contact with gate oxide film 6 in an island region isolated by field oxide film 2 and with its side surface extending in the direction of the channel length of channel region 5 in contact with the upper side of interlayer oxide film 11 and sidewall oxide film 12. Furthermore, as shown in FIG. 3, gate electrode 14 is formed with its bottom surface in contact with interlayer oxide film 11 on field oxide film 2 extending in a direction crossing the direction of the channel length of channel region 5. Gate electrode 14 comprises a polysilicon layer with phosphorus added. As shown in FIG. 2, an interlayer oxide film 15 is formed on the surface of gate electrode 14. A titanium silicide film 16 is formed on the surfaces of bit line ($BL_0$) 7, conductive layer ($D_0$) 8, bit line ($\overline{BL_0}$) 9, and bit line ($\overline{BL_1}$) 10. A contact hole ($CH_1$) 17 is provided so as to expose a part of the surface of titanium silicide film 16 formed on the surface of conductive layer ($D_0$) 8. An interlayer oxide film 18 is formed on the whole surface of p-type silicon semiconductor substrate 1 except for on a part of conductive layer ($D_0$) 8 and a part of gate electrode 14. A sidewall oxide film 19 is in contact with titanium silicide film 16 on conductive layer ($D_0$) 8 and is formed on side surfaces of interlayer oxide film 11, gate electrode 14, and interlayer oxide film 15.

A capacitor lower electrode ($E_0$) 20 is formed so as to be electrically connected via contact hole ($CH_1$) 17 to titanium silicide film 16. A capacitor lower electrode 20 comprises a polysilicon layer and is formed so as to extend to the upper hand of bit line ($BL_0$) 7. A dielectric film 21 is formed on the surface of capacitor lower electrode 20. A capacitor upper electrode (a plate electrode)($E_1$) 22 is formed so as to be opposed to the surface of capacitor lower electrode 20 with dielectric film 21 interposed. A BPSG film 23 is formed on the whole surface of p-type silicon semiconductor substrate 1 so as to coat capacitor upper electrode 22.

As described above, memory cells ($C_1$, $C_2$) 24 and 25 are implemented.

As shown in FIG. 3, a contact hole ($CH_0$) 26 is provided so as to expose a part of the surface of gate electrode 14. A word line ($WL_1$) 27 is electrically connected via contact hole ($CH_0$) 26 to gate electrode 14. A word line 27 is formed so as to extend along the direction of the channel length of channel region 5.

Now, referring to FIGS. 4A-4G, description is given on a manufacturing process of memory cells 24 and 25 implemented as described above.

Figure 4A:
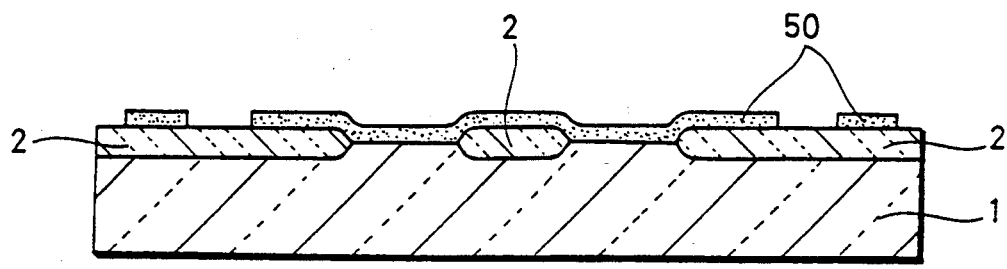
FIGS. 4A, 4B, 4C, 4D, 4E, 4F, and 4G are partial sectional views illustrating, sequentially, sectional structures in respective steps of a method of manufacturing a semiconductor memory device according to one embodiment of the present invention.

First, as shown in FIG. 4A, oxidation processing is selectively performed on a main surface of a p-type silicon semiconductor substrate 1 having an impurity concentration of approximately $1\times10^{15}cm^{-3}$ and resistivity of $10\Omega\cdot cm$. A field oxide film 2 is formed so as to isolate a prescribed element formation region. A polysilicon layer is formed on the whole surface of p-type silicon semiconductor substrate 1 by CVD method. The polysilicon layer is etched in the region of a part on field oxide film 2, and a polysilicon layer 50 is formed.

Figure 4B:
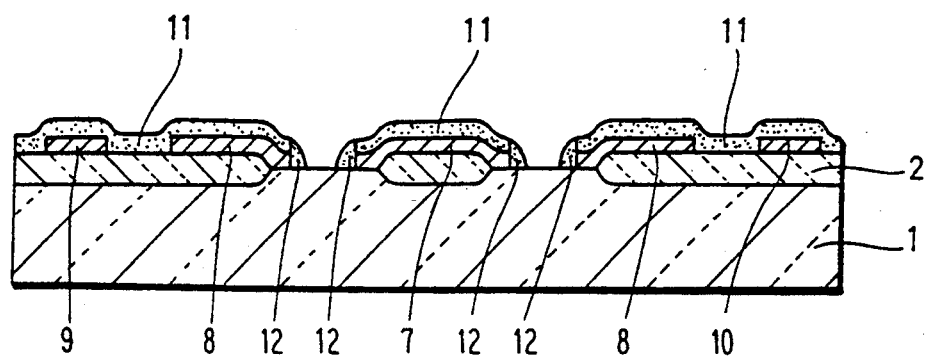

Next, as shown in FIG. 4B, an oxide film is formed on the whole surface of p-type silicon semiconductor substrate 1 by CVD method. Bit lines 7, 9, 10 and conductive layer 8 are formed in a part of an island region isolated by filed oxide film 2 by etching the oxide film and polysilicon layer 50. At this time, an interlayer oxide film 11 is formed on bit lines 7, 9, 10 and conductive layer 8. Then, an oxide film is formed on the whole surface of p-type silicon semiconductor substrate 1 by CVD method. A sidewall oxide film 12 is formed on the side surfaces of bit line 7, conductive layer 8, and interlayer oxide film 11 in the island region isolated by field oxide film 2 by removing the oxide film using anisotropic reactive ion etching technique.

Figure 4C:
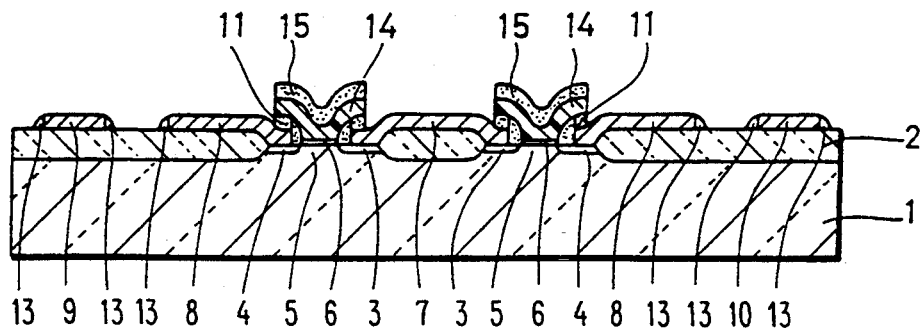

As shown in FIG. 4C, a gate oxide film 6 is formed on the exposed surface of p-type silicon semiconductor substrate 1. Then, a polysilicon layer with phosphorus added and an oxide film are laminated, sequentially, on the whole surface of p-type silicon semiconductor substrate 1 by CVD method. Etching processing is performed on the polysilicon layer and the oxide film so that a part of the polysilicon layer and the oxide film remain on the island region isolated by field oxide film 2 (See FIG. 4C) and field oxide film 2 adjacent to the island region (see FIG. 3). As a result, a gate electrode 14 and an interlayer oxide film 15 are formed. At this time, interlayer oxide film 11 formed in a region other than in the region under gate electrode 14 is etched so as to expose part of the surfaces of bit lines 7, 9, 10 and conductive layer 8. Furthermore, a sidewall oxide film 13 is formed on the side surfaces of bit lines 9, 10 and conductive layer 8 formed on field oxide film 2.

Then, arsenic ions is implanted from the upper hand of bit line 7 and conductive layer 8 to the surface of p-type silicon semiconductor substrate 1, using gate electrode 14 and interlayer oxide film 15 as a mask, on the condition that the accelerating voltage is 50 keV and the dosage is $4\times10^{15}cm^{-2}$. Performing heat treatment at a temperature of approximately 900° C. causes the arsenic ions implanted to bit line 7 and conductive layer 8 to be diffused in p-type silicon semiconductor substrate 1. This causes n+ source/drain regions 3 and 4 having an impurity concentration of approximately $1\times10^{20}cm^{-3}$ to be formed in the region of p-type silicon semiconductor substrate 1 adjacent to bit line 7 and conductive layer 8. A channel region 5 is formed between n+ source/drain regions 3 and 4.

Figure 4D:
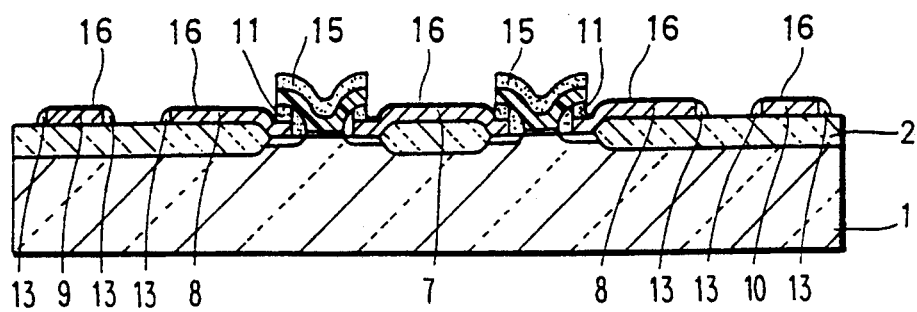

As shown in FIG. 4D, a titanium film is formed on the whole surface of p-type silicon semiconductor substrate by a sputtering method. Performing heat treatment at a temperature of approximately 600°-700° C. by a lamp anneal method causes polysilicon and titanium, constituting bit lines 7, 9, 10 and conductive layer 8, to show a silicide reaction. Then, the titanium film formed on field oxide film 2, sidewall oxide film 13, and interlayer oxide film 15 is etched away with an ammonium hydroxide/hydrogen peroxide ($NH_3 \cdot H_2O/H_2O_2$) solution. Performing heat treatment at a temperature above 800° C. using the lamp anneal method causes a titanium silicide film 16 to be formed.

Figure 4E:
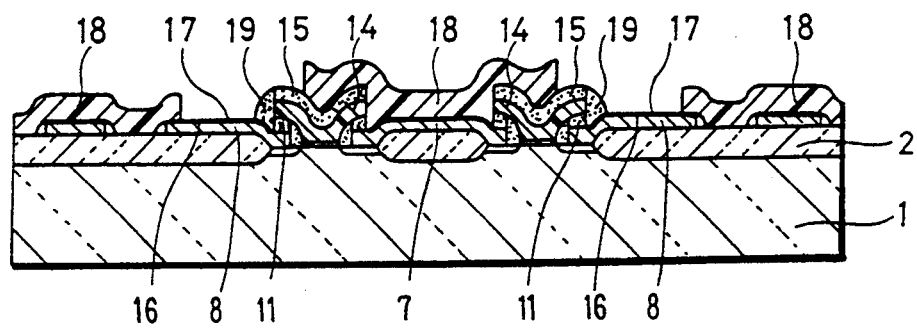

As shown in FIG. 4E, an oxide film is formed on the whole surface of p-type silicon semiconductor substrate 1 by CVD method. Selectively performing anisotropic reactive ion etching processing on the oxide film causes a part of the oxide film formed on conductive layer 8 and gate electrode 14 to be removed. Consequently, a contact hole 17 is formed so as to expose a part of the surface of titanium silicide film 16 formed on the surface of conductive layer 8. At this time, the oxide film remaining without being removed forms an interlayer oxide film 18. A sidewall oxide film 19 is formed on the side surfaces of interlayer oxide film 11, 15 and gate electrode 14.

Figure 4F:
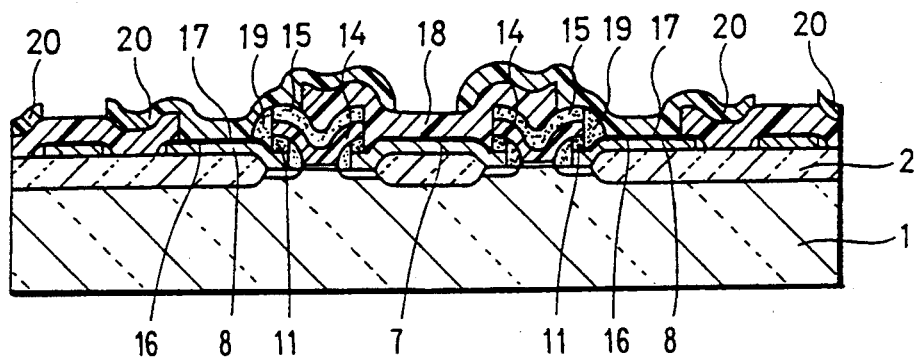

As shown in FIG. 4F, a polysilicon layer is formed on the whole surface of p-type silicon semiconductor substrate 1 by CVD method. A part of the polysilicon layer is connected via contact hole 17 to titanium silicide film 16, and etching processing is performed on the polysilicon layer so that it remains extending up to above bit line 7. Thus, a capacitor lower electrode 20 is formed.

Figure 4G:
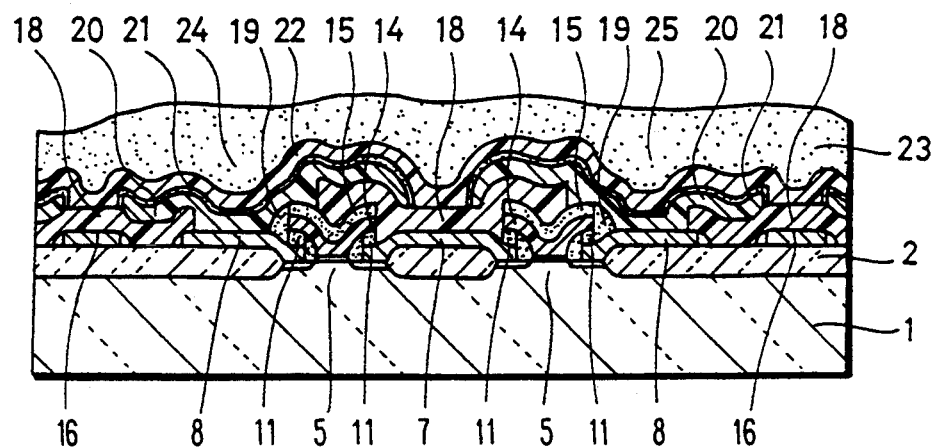
Figure 6:
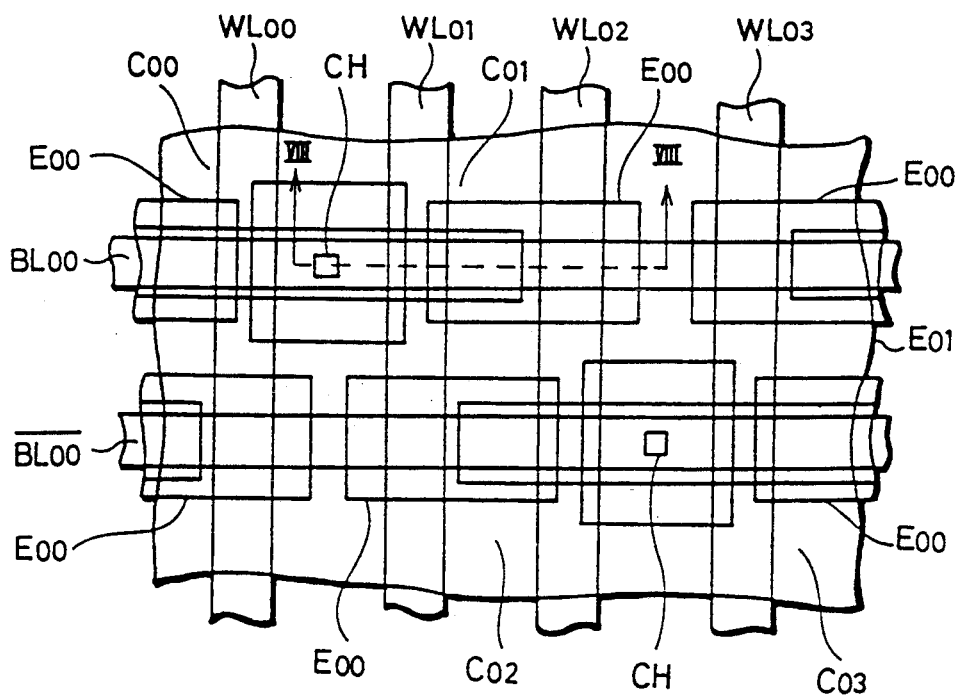
FIG. 6 is a partial plan view illustrating a planar arrangement of a memory cell in a conventional DRAM.
Figure 5:
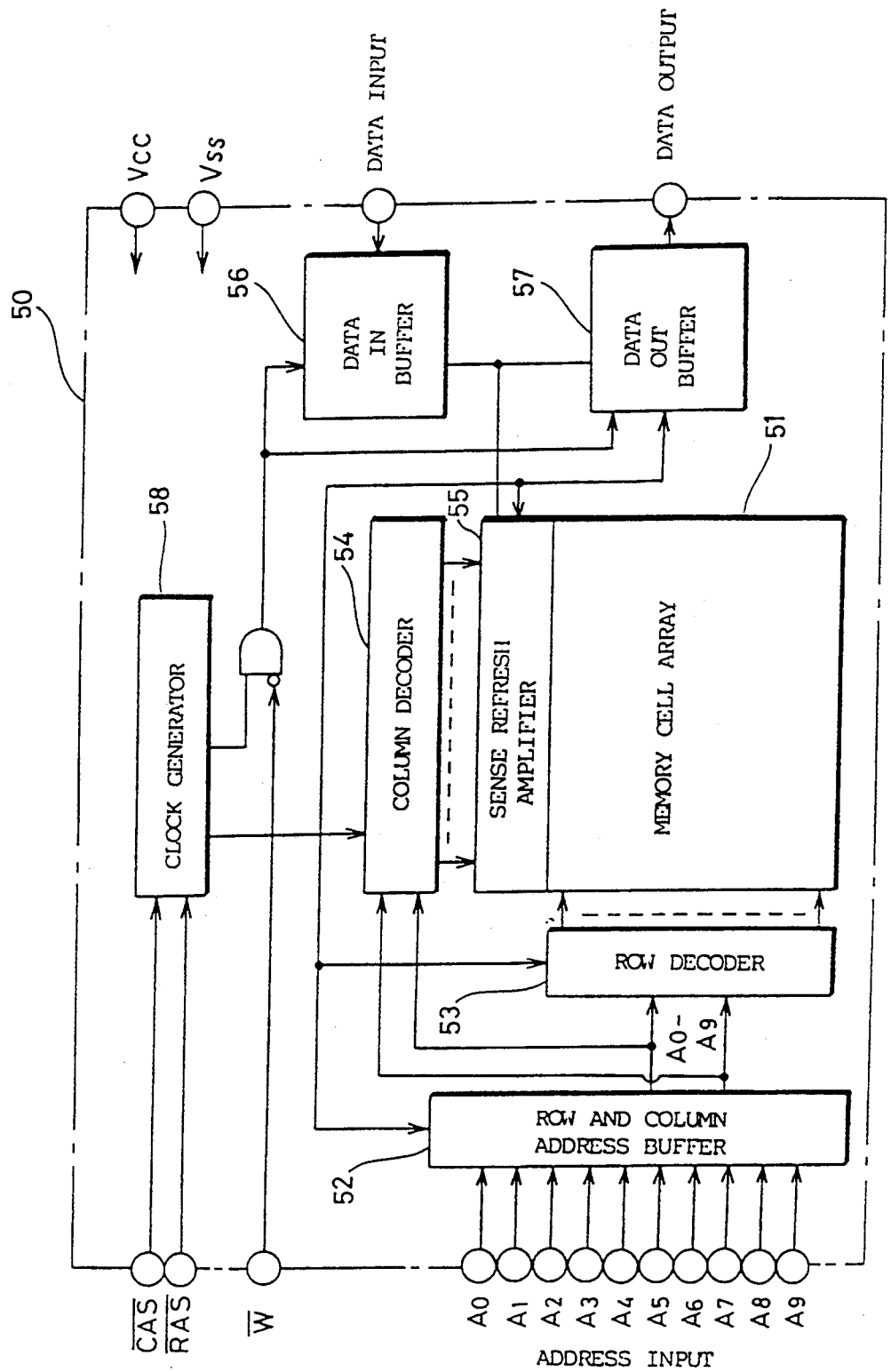
FIG. 5 is a block diagram illustrating a whole structure of a conventional dynamic random access memory (DRAM).
Figure 7:
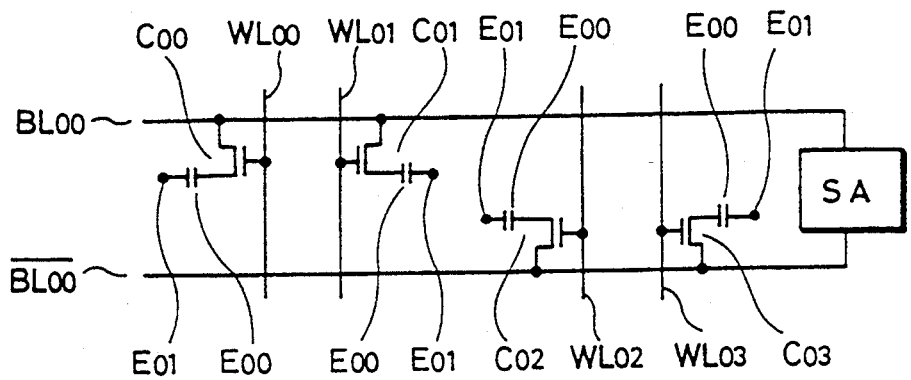
FIG. 7 is an equivalent circuit diagram corresponding to the planar arrangement of the memory cell illustrated in FIG. 6.
Figure 8:
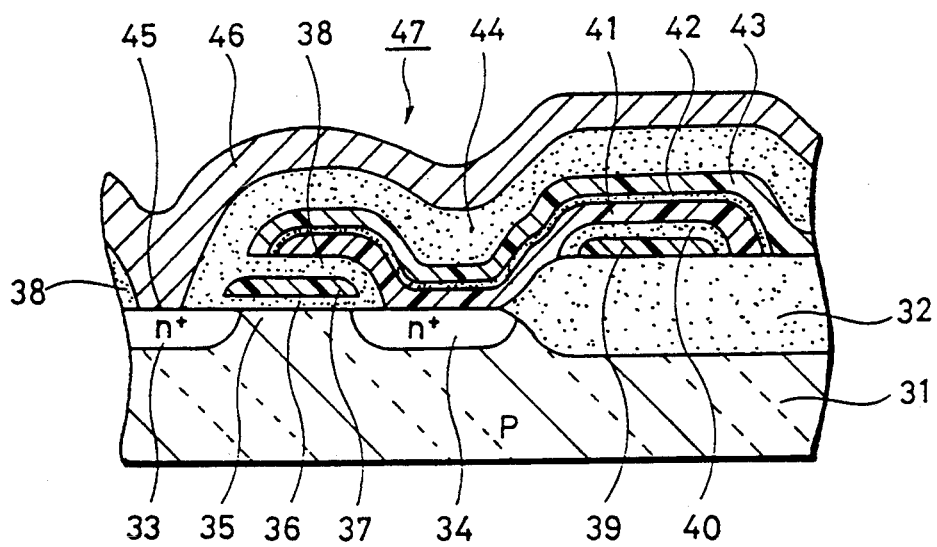
FIG. 8 is a partial sectional view illustrating a sectional structure taken along the line VIII—VIII in FIG. 6.

As shown in FIG. 4G, a nitride film is formed on the surface of capacitor lower electrode 20 by CVD method. Then, an oxide film is formed on the nitride film by performing heat treatment in an oxidizing atmosphere. In this manner, a dielectric film 21 is formed. Then, a polysilicon layer is formed by CVD method on the whole surface of gate electrode 14 formed on field oxide film 2 except for on a region of a part of gate electrode 14. This causes formation of a capacitor upper electrode (a plate electrode) 22 being opposed to the surface of capacitor lower electrode 20 with dielectric film 21 interposed. A BPSG film 23 is formed on the whole surface of p-type silicon semiconductor substrate 1 by CVD method. As shown in FIG. 3, interlayer oxide films 15, 18 and BPSG film 23 are etched in a part of the region in which capacitor upper electrode 22 is not formed. This causes a contact hole 26 to be formed so as to expose a part of the surface of gate electrode 14.

A metal layer including aluminum is formed on the whole surface of p-type silicon semiconductor substrate 1 by the sputtering method. Etching processing is performed on the metal layer so that a part of the metal layer is electrically connected via contact hole 26 to gate electrode 14 and remains extending along the direction of the channel length of channel region 5. In this manner, a word line 27 is formed as shown in FIG. 3. Thus, memory cells 24 and 25 are completed.

In a semiconductor memory device implemented as described above, both ends of gate electrode 14 extending in the direction of the channel length of channel region 5 are formed so as to respectively extend up to above the interlayer oxide film 11 on bit line 7 or the interlayer oxide film 11 on conductive layer 8. Accordingly, the cross-sectional area of gate electrode 14 along the direction of the channel length of channel region 5 increases. Consequently, it is possible to prevent increase in resistance when current flows in gate electrode 14. Therefore, the delay of a response to a signal is prevented, and the operating speed is enhanced. It is possible to provide a semiconductor memory device suitable for increase in speed.

On the other hand, the capacitor is placed above bit line 7 and conductive layer 8 and placed below word line 27. This increases the freedom of the region forming the capacitor. The capacitor may be formed extending through above gate electrode 14 up to above bit line 7. Therefore, it is possible to provide a semiconductor memory device in which the area of the capacitor increases and capacitance of the capacitor can be sufficiently secured in case of making miniaturization of the memory cell.

Furthermore, bit line 7 and conductive layer 8 are connected to n+ source/drain region 3 and n+ source/drain region 4, respectively, without extending through contact holes. This makes it possible that bit line 7 is connected to the source/drain region 3 formed on silicon semiconductor substrate 1 without being influenced by the step part of the lamination structure. This means that connection between the bit line and the impurity region can be performed without being influenced by the aspect ratio. Accordingly, disconnection of bit line 7 is prevented, and it is possible to provide a semiconductor memory device with high reliability.

Furthermore, according to the method of manufacturing a semiconductor memory device as described above, the capacitor is formed after bit line 7 is formed so as to be connected to n+ source/drain region 3 without extending through a contact hole. Therefore, the step of forming a contact hole for connecting the bit line becomes unnecessary. On the other hand, both ends of gate electrode 14 extending in the direction of the channel length of channel region 5 are formed, respectively, so as to extend up to above the interlayer oxide film 11 on bit line 7 or above the interlayer oxide film 11 on conductive layer 8. Contact hole 26 is formed by etching interlayer oxide films 15, 18 and BPSG film 23 formed on gate electrode 14. This makes it possible to prevent the aspect ratio of contact hole 16 for connecting word line 27 to gate electrode 14. Accordingly, it is possible to connect bit line 7 to n+ source/drain region 3 and word line 27 to gate electrode 14 without carrying out a photolithography process with a high precision. Therefore, manufacture of a semiconductor memory device becomes easier.

Furthermore, in the above embodiment, gate electrode 14 is implemented with a polysilicon layer with phosphorus added. However, the same effect as that of the above embodiment is secured if gate electrode 14 is implemented with a refractory metal film, a refractory metal silicide film, or a lamination structure of a refractory metal silicide film and a polysilicon layer.

Moreover, in the above embodiment, titanium silicide film 16 is formed by inducing a silicide reaction of polysilicon and titanium constituting bit lines 7, 9, 10 and conductive layer 8 after forming a titanium film on the whole surface of p-type silicon semiconductor substrate 1 by the sputtering method. However, the same effect as that of the above embodiment secured if titanium silicide film 16 is formed by inducing a silicide reaction of polysilicon and titanium after forming a titanium film only on the surfaces of bit lines 7, 9, 10 and conductive layer 8 by a selective CVD method.

Furthermore, although the titanium silicide film is formed on the surfaces of bit lines 7, 9, 10 and conductive layer 8 in the above embodiment, the same effect as that of the above embodiment can be secured if a molybdenum silicide film, a tungsten silicide film, or a tantalum silicide film is formed.

Moreover, memory cells 24 and 25 are formed on p-type silicon semiconductor substrate 1 in the above embodiment, the same effect as that of the above embodiment can be secured if the conductive type is reversed and the memory cells are formed on a n-type silicon semiconductor substrate.

As described above, according to the present invention, it is possible to provide a field effect transistor in which when current flows in the gate electrode, increase in resistance can be prevented even though the channel region is miniaturized and which is suitable for increase in speed. It is also possible to provide a semiconductor memory device in which the area of the capacitor can be increased and capacitance of the capacitor can be sufficiently secured in case of making miniaturization of the memory cell. It is also possible to provide a semiconductor memory device in which disconnection of the bit line caused by increase in the aspect ratio can be prevented and which has high reliability. Besides, since it is possible to connect the conductive layer to the impurity region of the semiconductor substrate without carrying out a photolithography process with high precision, it becomes easier to manufacture a field effect transistor or a semiconductor memory device.

The foregoing and other objects, features, aspects and advantages of the present invention will become more apparent from the following detailed description of the present invention when taken in conjunction with the accompanying drawings.

What is claimed is:

1. A semiconductor memory device comprising:
   a semiconductor substrate of a first conductive type having a main surface;
   a pair of impurity regions of second conductive type spaced from each other in a direction defining a channel length of a channel region of a first memory cell on the main surface of said semiconductor substrate;
   a gate electrode formed on said channel region with a first insulating layer interposed therebetween;
   a first conductive layer electrically connected to one of said impurity regions;
   a first electrode layer of a capacitor electrically connected to said first conductive layer, said first electrode layer having a portion above and overlapping with said gate electrode;

a second electrode of the capacitor opposite a surface of the first electrode layer of said capacitor with a dielectric layer interposed therebetween;

a second conductive layer electrically connected to said gate electrode and constituting a part of a word line; and a third conductive layer formed in contact with another one of said impurity regions and with an impurity region of a second memory cell adjacent said first memory cell, said gate electrode having a portion above and overlapping with said third conductive layer;

an intercell insulating layer provided between said semiconductor substrate and said third conductive layer to separate the another one of said impurity regions from the impurity region of said second memory cell;

wherein said second conductive layer includes a first part in contact with a surface of said gate electrode; and a second part extending from said first part and formed on the second electrode of said capacitor with a second insulating layer interposed therebetween.

2. The semiconductor memory device according to claim 1, wherein said third conductive layer forms a part of a bit line.

3. A semiconductor memory device according to claim 2, wherein said word line extends in said channel length direction, and said bit line extends in a direction crossing said channel length direction.

4. A semiconductor memory device comprising:

a semiconductor substrate of a first conductive type having a main surface;

a first insulating layer formed so as to isolate an element formation region on the main surface of said semiconductor substrate;

a pair of impurity regions of a second conductive type spaced from each other in a direction defining a channel length of a channel region of a first memory cell in said element formation region and formed, respectively, so as to be adjacent to said first insulating layer;

a first conductive layer electrically connected to one of said impurity regions and to an impurity region of a second memory cell adjacent said first memory cell to form a bit line, an intercell portion of said first insulating layer being provided between said first conductive layer and said semiconductor substrate to separate the one of said impurity regions from the impurity region of said second memory cell;

said first conductive layer including a first part in contact with the surface of said one of said impurity regions; and a second part extending from said first part and formed on said first insulating layer adjacent to said one of said impurity regions;

a second conductive layer electrically connected to the other one of said impurity regions and electrically connected to an electrode of a capacitor, said second conductive layer including a first part in contact with the surface of the other one of said impurity regions; and a second part extending from said first part and formed on said first insulating layer adjacent to the other one of said impurity regions, said second part formed beneath and contacting the capacitor electrode; and a gate electrode formed on said channel region with a second insulating layer interposed therebetween, said gate electrode having a portion formed above and overlapping with said second conductive layer, said capacitor electrode having a portion formed above and overlapping with said gate electrode.

5. The semiconductor memory device according to claim 4, further comprising a third conductive layer electrically connected to said gate electrode and forming a part of a word line.

6. The semiconductor memory device according to claim 5, wherein said bit line extends in a direction crossing the channel length direction, and said word line extends in the channel length direction.

7. The device of claim 1, wherein said first electrode layer has a portion above said portion of the gate electrode overlapping with said third conductive layer.

8. The device of claim 4, wherein said capacitor electrode has a portion above said portion of the gate electrode overlapping with said second conductive layer.

* * * * *

UNITED STATES PATENT AND TRADEMARK OFFICE
CERTIFICATE OF CORRECTION

PATENT NO. : 5,428,235
DATED : June 27, 1995
INVENTOR(S) : Masahiro SHIMIZU et al.

It is certified that error appears in the above-indentified patent and that said Letters Patent is hereby corrected as shown below:

On the title page, item [30] should read as follows:

--[30] Foreign Application Priority Data

Jun. 18, 1990 [JP] Japan . . . . . . 2-160802--

Signed and Sealed this

Fourteenth Day of November, 1995

Attest:

BRUCE LEHMAN

*Attesting Officer*      *Commissioner of Patents and Trademarks*